US008411499B2

(12) United States Patent
Ohmori et al.

(10) Patent No.: US 8,411,499 B2
(45) Date of Patent: Apr. 2, 2013

(54) RECORDING METHOD FOR MAGNETIC MEMORY DEVICE

(75) Inventors: Hiroyuki Ohmori, Kanagawa (JP); Masanori Hosomi, Kanagawa (JP); Tetsuya Yamamoto, Kanagawa (JP); Yutaka Higo, Kanagawa (JP); Kazutaka Yamane, Kanagawa (JP); Yuki Oishi, Kanagawa (JP); Hiroshi Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 367 days.

(21) Appl. No.: 12/936,441

(22) PCT Filed: Apr. 15, 2009

(86) PCT No.: PCT/JP2009/057621
§ 371 (c)(1),
(2), (4) Date: Oct. 5, 2010

(87) PCT Pub. No.: WO2009/128485
PCT Pub. Date: Oct. 22, 2009

(65) Prior Publication Data
US 2011/0026322 A1 Feb. 3, 2011

(30) Foreign Application Priority Data
Apr. 17, 2008 (JP) .................................. 2008-107768

(51) Int. Cl.
*G11C 11/14* (2006.01)
(52) U.S. Cl. ......... 365/171; 365/148; 365/158; 365/172
(58) Field of Classification Search .................... 365/48, 365/55, 62, 66, 74, 78, 80–93, 100, 130, 365/131, 148, 158, 171–173, 209, 213, 225.5, 365/230.07, 232, 243.5; 257/295, 421, 422, 257/427, E21.665, E27.006; 438/3; 977/933–935
See application file for complete search history.

(56) References Cited

U.S. PATENT DOCUMENTS 7,525,166 B2 4/2009 Hosomi et al.
2007/0258281 A1 11/2007 Ito et al.
(Continued)

FOREIGN PATENT DOCUMENTS

JP 2003-017782 1/2003
JP 2007-287923 11/2007
(Continued)

OTHER PUBLICATIONS

F. J. Albert et al.; Spin-polarized current switching of a Co thin film nanomagnet; Applied Physics Letters; vol. 77, No. 23, Dec. 4, 2000.
(Continued)

*Primary Examiner* — Harry W Byrne
(74) *Attorney, Agent, or Firm* — SNR Denton US LLP

(57) ABSTRACT

[Object] To provide a recording method for a magnetic memory device including a recording layer that is capable of changing a magnetization direction and holds information as a magnetization direction of a magnetic body and a magnetization reference layer that is provided with respect to the recording layer with an insulation layer interposed therebetween and becomes a reference of the magnetization direction, the magnetic memory device being recorded with information by a current flowing between the recording layer and the magnetization reference layer via the insulation layer, the recording method being capable of maintaining, even when a write pulse considerably higher than an inversion threshold value is applied, a write error rate of $10^{-25}$ or less that is obtained when a write pulse a little larger than the inversion threshold value is applied.
[Solving Means] While taking time of 2 ns or more, write power injected at a time a write pulse falls is reduced gradually. At this time, it is favorable to keep a rate of decline of a voltage of the write pulse at the time of the fall small until the voltage of the write pulse at the time of the fall becomes smaller than an inversion threshold voltage of the magnetic memory device.

17 Claims, 12 Drawing Sheets

U.S. PATENT DOCUMENTS

2008/0003717 A1 1/2008 Zhou et al.
2008/0225577 A1* 9/2008 Hosotani et al. .............. 365/158
2008/0310215 A1* 12/2008 Ueda ............................ 365/158

FOREIGN PATENT DOCUMENTS

| JP | 2007-300078 | 11/2007 |
|---|---|---|
| JP | 2007-300079 | 11/2007 |

OTHER PUBLICATIONS

International Search Report dated Jul. 14, 2009.

* cited by examiner (a)

(b)

RECORDING METHOD FOR MAGNETIC MEMORY DEVICE

TECHNICAL FIELD

The present invention relates to a recording method for a magnetic memory device including a recording layer that is capable of changing a magnetization direction and holds information as a magnetization direction of a magnetic body and a magnetization reference layer that is provided with respect to the recording layer with an insulation layer interposed therebetween and becomes a reference of the magnetization direction, the magnetic memory device being recorded with information by a current flowing between the recording layer and the magnetization reference layer via the insulation layer.

BACKGROUND ART

In information apparatuses such as a computer, a DRAM (Dynamic RAM) with which a high-speed operation and high-density recording are possible is widely used as a RAM (Random Access Memory). However, since the DRAM is a volatile memory in which information is deleted when power is turned off, a high-speed, high-density, and large-capacity nonvolatile memory that is capable of holding information even when power is shut off and is indispensable for reducing power consumption of an apparatus is strongly demanded.

A flash memory and the like is put to practical use as the nonvolatile memory, but a magnetic memory that uses a magnetoresistance effect is attracting attention and being developed as a high-speed, large-capacity, and low-power-consumption nonvolatile memory in recent years and is thus being developed. For example, an MRAM (Magnetic RAM) constituted of a magnetic memory device that uses a TMR (Tunnel Magnetoresistance) effect, that is, an MTJ device and onto which information is recorded by inverting a magnetization direction of a recording layer by a magnetic field induced by a current is put to practical use (e.g., MR2A16 (product name) available from Freescale Semiconductor, Inc.).

FIG. 9(a) is an explanatory diagram showing a basic structure of an MTJ device and an operation of reading out recorded information. As shown in FIG. 9(a), an MTJ device 100 has a structure in which a tunnel insulation layer 104 as a thin nonmagnetic insulation layer is interposed between a recording layer 105 and a magnetization reference layer 103 as two ferromagnetic layers, that is, a so-called MTJ (Magnetic Tunnel Junction). The recording layer 105 is constituted of a ferromagnetic conductor having uniaxial magnetic anisotropy and is capable of changing a magnetization direction by an external operation and holding the magnetization direction as information. For example, which of "parallel" and "nonparallel" the magnetization direction is with respect to a magnetization direction of the magnetization reference layer 103 is stored as information of "0" and "1".

For reading out information from the MTJ device 100, a TMR effect in which a resistance value with respect to a tunnel current that flows between the recording layer 105 and the magnetization reference layer 103 via the tunnel insulation layer 104 is changed by a relative difference in the magnetization directions between the two magnetic layers described above is used. The resistance value used herein takes a minimum value when the magnetization direction of the recording layer 105 and that of the magnetization reference layer 103 are parallel and takes a maximum value when the magnetization directions are nonparallel.

FIG. 9(b) is a partial perspective view showing an example of a memory cell structure of an MRAM constituted of the MTJ device 100. In the MRAM, a memory cell corresponding to 1 bit is formed by arranging word lines as row wirings and bit lines as column wirings in a matrix and arranging the MTJ device 100 at intersections thereof.

At an upper portion of the memory cell, a write bit line 122 and a read bit line 123 are provided with an interlayer insulation film interposed therebetween, the MTJ device 100 is provided below the read bit line 123 while being in contact therewith, and a write word line 121 is provided below an extraction electrode layer 106 of the MTJ device 100 with an insulation layer interposed therebetween.

On the other hand, at a lower portion of the memory cell, a MOS (Metal Oxide Semiconductor)-type field-effect transistor is provided on a semiconductor substrate 111 such as a silicon substrate as a selection transistor 110 for selecting a memory cell at a time of a read operation. A gate electrode 115 of the transistor 110 is formed as a band connecting the cells and also functions as a read word line. Moreover, a source area 114 is connected to the extraction electrode layer 106 of the MTJ device 100 via a read connection plug 107, and a drain area 116 is connected to a sense line 124 as a read row wiring.

In the MRAM having the structure as described above, write (recording) of information to the MTJ device 100 of a desired memory cell is carried out by causing write currents to flow through the write word line 121 and the write bit line 122 of a row and column included in the memory cell and causing a synthetic magnetic field of magnetic fields generated by those currents at intersections of the two write wirings. By the synthetic magnetic field, the recording layer 105 of the MTJ device 100 of the desired memory cell is magnetized in a predetermined magnetization direction, that is, a direction that is "parallel" or "nonparallel" to the magnetization direction of the magnetization reference layer 103, to thus write (record) information.

Further, for reading out information from the MTJ device 100, a selection signal is applied to the gate electrode 115 as a read word line of a row included in a desired memory cell to put the entire selection transistor 110 of that row to an ON (conductive) state. At the same time, a read voltage is applied between the read bit line 123 of a column included in the desired memory cell and the sense line 124. As a result, only a desired memory cell is selected, and a difference of the magnetization direction of the recording layer 105 of the MTJ device 100 is detected as a difference in a level of a tunnel current flowing through the MTJ device 100 using the TMR effect. The tunnel current is extracted to a peripheral circuit (not shown) from the sense line 124 and measured.

It is reported that since the TMR-type MRAM is a nonvolatile memory from which information is read out using a magnetoresistance effect that is based on a spin-dependent conduction phenomenon unique to a nanomagnet and rewrite is performed by inverting a magnetization direction, rewrite can be practically performed an unlimited number of times and a high-speed access time is realized (see, for example, "ISSCC Digest of Technical Papers", R. Scheuerlein et al., pp. 128-129, February 2000).

However, in the MRAM on which write is performed using a current magnetic field, it is necessary to cause a large current (e.g., about several mA) to flow for rewrite, with the result that power consumption increases. Moreover, since a write wiring becomes thin while a current required for rewrite tends to increase along with a miniaturization of an MTJ device, it becomes difficult to cause a sufficient current for rewrite to flow. Further, with a progress of a high integration, a possibility of information being erroneously written in a different adjacent memory cell increases. Furthermore, since both a write wiring and a read wiring are required, a structure becomes complex. As a result, an increase in a density and capacity of the MRAM on which write is performed using a current magnetic field is limited.

In this regard, a magnetic memory device that uses a magnetization inversion by a spin injection for write is attracting attention as a device that writes (records) information onto a recording layer of a magnetic memory device based on a different principle. The spin injection is an operation of causing a current to flow through a ferromagnetic conductive layer (magnetization reference layer) whose magnetization direction is fixed to generate a current constituted of an electron ensemble whose spin direction is polarized in one direction (spin-polarized current) and injecting the current into a magnetic conductive layer (recording layer) that is capable of changing its magnetization direction. By such an operation, a force that acts to make the magnetization direction of the recording layer and that of the magnetization reference layer coincide (torque) is caused by a mutual action between a spin-polarized electron and an electron of a magnetic body constituting the recording layer at a time the spin-polarized current flows through the recording layer. Thus, by causing the spin-polarized current having a current density equal to or larger than a certain threshold value to flow, the magnetization direction of the recording layer can be inverted (see, for example, Patent Document 1 and Non-patent Document 1 to be described later).

FIG. 10 is a partial perspective view showing an example of a structure of an MRAM shown in Patent Document 2 to be described later, that is constituted of an MTJ device whose magnetization direction is inverted by a spin injection (hereinafter, referred to as spin injection MTJ device) and uses a magnetization inversion by the spin injection (hereinafter, referred to as spin torque MRAM). In the spin torque MRAM, word lines 215 as row wirings and bit lines 218 as column wirings are arranged in a matrix, and one spin injection MTJ device 220 is arranged at each intersection, to thus form a memory cell corresponding to 1 bit. FIG. 10 shows four memory cells.

On a semiconductor substrate 211 at a lower portion, a selection transistor 210 to be described later is formed in each memory cell, and the word line 215 also functions as a gate electrode of the selection transistor 210. Moreover, a drain area 216 is commonly formed for the selection transistors shown on both sides in the figure, and a row wiring 219 is connected to the drain area 216.

FIG. 11 is a partial cross-sectional diagram showing a memory cell structure of the spin torque MRAM. At a center portion of the memory cell, the spin injection MTJ device 220 is formed by laminating, in the stated order from the bottom layer, a base layer 201, an antiferromagnetic layer 202, a magnetization fixing layer 203*a*, an intermediate layer 203*b*, a magnetization reference layer 203*c*, a tunnel insulation layer 204, a recording layer 205, and a protective layer 206. The layer structure of the spin injection MTJ device 220 is basically the same as that of the normal MTJ device 100.

The magnetization fixing layer 203*a*, the intermediate layer 203*b*, and the magnetization reference layer 203*c* are laminated on the antiferromagnetic layer 20202 and constitute a fixed magnetization layer as a whole. A magnetization direction of the magnetization fixing layer 203*a* constituted of a ferromagnetic conductor is fixed by the antiferromagnetic layer 20202. The magnetization reference layer 203*c* similarly constituted of a ferromagnetic conductor forms an antiferromagnetic bond with the magnetization fixing layer 203*a* via the intermediate layer 203*b* as a nonmagnetic layer. As a result, a magnetization direction of the magnetization reference layer 203*c* is fixed in a direction opposite to the magnetization direction of the magnetization fixing layer 203*a*. In the example shown in FIG. 11, the magnetization direction of the magnetization fixing layer 203*a* is fixed in a left-hand direction, and the magnetization direction of the magnetization reference layer 203*c* is fixed in a right-hand direction.

Since a sensitivity of the fixed magnetization layer with respect to an external magnetic field can be lowered when the fixed magnetization layer has the multilayer ferrimagnetic structure described above, it is possible to suppress a magnetization fluctuation of the fixed magnetization layer due to the external magnetic field and improve a stability of the MTJ device. In addition, since magnetic fluxes that leak out from the magnetization fixing layer 203*a* and the magnetization reference layer 203*c* cancel each other out, the magnetic flux that leaks out from the fixed magnetization layer can be suppressed to a minimum level by adjusting film thicknesses of those layers.

The recording layer 5 is constituted of a ferromagnetic conductor having uniaxial magnetic anisotropy and capable of changing a magnetization direction by an external operation and holding the magnetization direction as information. For example, which of "parallel" and "nonparallel" the magnetization direction is with respect to the magnetization direction of the magnetization reference layer 203*c* is stored as information of "0" and "1". The tunnel insulation layer 204 as a thin nonmagnetic insulation layer is interposed between the magnetization reference layer 203*c* and the recording layer 205, and the magnetization reference layer 203*c*, the tunnel insulation layer 204, and the recording layer 205 form an MTJ (Magnetic Tunnel Junction).

On the other hand, at a lower portion of the memory cell, a MOS-type field-effect transistor constituted of a gate insulation film 212, a source electrode 213, a source area 214, a gate electrode 215, the drain area 216, and drain electrodes 217 is provided as the selection transistor 210 for selecting a memory cell in a device-isolated well area 211*a* of the semiconductor substrate 211 such as a silicon substrate.

As described above, the gate electrode 215 of the selection transistor 210 is formed as a band connecting the cells and also functions as a word line as a first row wiring. Moreover, the drain electrodes 217 are connected to the row wiring 219 as a second row wiring, and the source electrode 213 is connected to the base layer 201 of the spin injection MTJ device 220 via a connection plug 207. On the other hand, the protective layer 206 of the spin injection MTJ device 220 is connected to the bit line 218 as the column wiring provided at the upper portion of the memory cell.

For recording information onto the spin injection MTJ device 220 of a desired memory cell, a selection signal is applied to the word line 215 of a row included in the desired memory cell to put the entire selection transistor 210 of that row to an ON (conductive) state. At the same time, a write voltage is applied between the bit line 218 of a column included in the desired memory cell and the row wiring 219. As a result, a desired memory cell is selected, a spin-polarized current flows through the recording layer 205 of the spin injection MTJ device 220, and the recording layer 205 is magnetized in a predetermined magnetization direction, to thus record information.

At this time, the magnetization direction of the magnetization reference layer 203*c* of the spin injection MTJ device 220 is first "nonparallel" to the magnetization direction of the recording layer 205. When inverting the magnetization direction of the recording layer 205 to be "parallel" to the magnetization direction of the magnetization reference layer 203c by write, a write current having a current density equal to or larger than a threshold value is caused to flow from the recording layer 205 to the magnetization reference layer 203c as shown in FIG. 11. Accordingly, a spin-polarized electron stream having an electron density equal to or larger than a threshold value flows substantively from the magnetization reference layer 203c to the recording layer 205 to thus cause a magnetization inversion.

Conversely, when inverting the magnetization direction of the magnetization reference layer 203c that is "parallel" to the magnetization direction of the recording layer 205 to be "non-parallel", a write current having a current density equal to or larger than a threshold value is caused to flow in the opposite direction, that is, from the magnetization reference layer 203c to the recording layer 205 so that an electron stream having an electron density equal to or larger than a threshold value flows substantively from the recording layer 205 to the magnetization reference layer 203c.

Further, information is read out from the spin injection MTJ device 220 using the TMR effect as in the case of the MTJ device 100. While write and read with respect to the spin injection MTJ device 220 both use a mutual action between the electron of the recording layer 205 and the spin-polarized current that flows through the recording layer 205, read is performed in an area where the current density of the spin-polarized current is small, whereas write is performed in an area where the current density of the spin-polarized current is large and exceeds a threshold value.

Whether the magnetization inversion by the spin injection can be performed depends on the current density of the spin-polarized current. Thus, as a volume of the recording layer decreases in the spin injection MTJ device 220, the magnetization inversion can be performed with a smaller current in proportion to the volume (see Non-patent Document 1). Further, since information is written to a memory cell selected by the selection transistor 210, there is no fear of information being erroneously written to a different adjacent cell unlike write that uses a current magnetic field. Furthermore, since most of the wirings can be shared in write and read, a mechanism can be simplified. Moreover, since an influence of a shape of a magnetic body is smaller than that in the case of the write that uses a magnetic field, a yield ratio in production is apt to increase. Based on those points, the spin torque MRAM is more suited for realizing a miniaturization and an increase in the density and capacity than the MRAM on which write is performed using a current magnetic field.

However, a different problem arises when write (recording) is performed using the selection transistor 210. Specifically, a current that can be caused to flow through the spin injection MTJ device 220 at the time of write is limited by a current that can be caused to flow through the selection transistor 210 (saturation current of transistor). In general, since the saturation current of the transistor becomes smaller as a gate width or gate length of the transistor becomes smaller, a miniaturization of the selection transistor 210 is limited for securing a write current to the spin injection MTJ device 220. Therefore, for miniaturizing the selection transistor 210 as much as possible and maximumly increasing the density and capacity of the spin torque MRAM, it is necessary to reduce a threshold value of a write current as much as possible.

Moreover, also for preventing an insulation breakdown of the tunnel insulation layer 204 from occurring, it is necessary to reduce a threshold value of a write current. In addition, also for reducing power consumption of the MRAM, it is necessary to reduce a threshold value of a write current as much as possible.

It is phenomenologically shown that a threshold value of a current required for the magnetization inversion by a spin injection is proportional to a spin brake constant $\alpha$, a square of a saturated magnetization amount Ms, and a volume V of the recording layer 205 and inversely proportional to a spin injection efficiency $\eta$. Therefore, by appropriately selecting them, a threshold value of a current required for the magnetization inversion can be reduced.

On the other hand, however, for the spin injection MTJ device 220 to be a reliable memory device, it is necessary to secure memory holding characteristics (thermal stability of magnetization) of the recording layer 205 so that the magnetization direction does not change by a thermal motion. The thermal stability is proportional to the saturated magnetization amount Ms and the volume V of the recording layer 205.

The saturated magnetization amount Ms and the volume V of the recording layer 205 relate to both a threshold value of a current required for the magnetization inversion and the thermal stability and are in a tradeoff relationship in which, by reducing a threshold value of a current required for the magnetization inversion by reducing those factors, the thermal stability is also lowered.

Therefore, it is necessary to improve, for reducing a threshold value of a current required for the magnetization inversion, mainly the spin injection efficiency $\eta$ while carefully taking a balance with a securement of the thermal stability. The inventors of the present invention have vigorously developed an MTJ material that is capable of realizing both a reduction in a threshold value of a current density required for a magnetization inversion and a securement of memory holding characteristics (thermal stability) so that a spin torque MRAM becomes a competitive memory as compared to other memories (see Japanese Patent Application Laid-open No. 2006-165265, Japanese Patent Application Laid-open No. 2007-103471, Japanese Patent Application Laid-open No. 2007-48790, Patent Document 2, Japanese Patent Application No. 2006-350113, etc.). As a result, the MTJ material is now close to being realized.

Patent Document 1: Japanese Patent Application Laid-open No. 2003-17782 (p. 6 and 7, FIG. 2)

Patent Document 2: Japanese Patent Application Laid-open No. 2007-287923 (p. 7-15, FIG. 2)

Non-patent Document 1: "Appl. Phys. Lett.", F. J. Albert et al., Vol. 77 (2002), p. 3809

DISCLOSURE OF THE INVENTION

Problems to be Solved by the Invention

However, as a result of producing a spin injection MTJ device having a small threshold value of a write current density using the MTJ material described above and examining it, the inventors of the present invention have found that, conventionally, a peculiar phenomenon unreported even in research papers and conference presentations appears. Specifically, in the spin injection MTJ device, it has been confirmed that, irrespective of the fact that a write error rate of $10^{-25}$ or less can be secured (as an estimated value obtained by an extrapolation) when a write pulse to be applied is set to be a little larger than an inversion threshold value in consideration of the write error rate, when the write pulse to be applied is set to be considerably larger than the inversion threshold value, the write error rate tends to rather increase as the write pulse becomes larger (see FIG. 12). Here, an error that is caused by a recording voltage larger than the inversion threshold value is referred to as "high recording voltage error".

In the actual write to a spin torque MRAM memory chip having a capacity of several-hundred Mbit, a write pulse considerably larger than a mean value of the inversion threshold values is set to be applied while taking into account a variation of the inversion threshold value of the spin injection MTJ device and a variation of the inversion threshold value that is due to the transistor and wirings. Therefore, if the phenomenon described above appears, a write error rate of $10^{-25}$ or less cannot be secured in the actual write to the spin torque MRAM memory chip.

The present invention has been made in view of the circumstances as described above, and it is therefore an object of the invention to provide a recording method for a magnetic memory device including a recording layer that is capable of changing a magnetization direction and holds information as a magnetization direction of a magnetic body and a magnetization reference layer that is provided with respect to the recording layer with an insulation layer interposed therebetween and becomes a reference of the magnetization direction, the magnetic memory device being recorded with information by a current flowing between the recording layer and the magnetization reference layer via the insulation layer. The recording method for a magnetic memory device is capable of securing a write error rate obtained when a write pulse a little larger than an inversion threshold value is applied even when a write pulse considerably larger than the inversion threshold value is applied.

Means for Solving the Problems

Devoting to the studies, the inventors of the present invention have found that the problems above can be solved by devising a shape of a fall of a write pulse and thus completed the present invention.

Specifically, according to the present invention, there is provided a recording method for a magnetic memory device including at least a recording layer that is constituted of a ferromagnetic conductor, capable of changing a magnetization direction, and holds information as a magnetization direction of a magnetic body and a magnetization reference layer whose magnetization direction is fixed and that is provided with respect to the recording layer with an insulation layer interposed therebetween, constituted of a ferromagnetic conductor, and becomes a reference of the magnetization direction, the magnetic memory device being recorded with information by a current flowing between the recording layer and the magnetization reference layer via the insulation layer, the recording method being characterized by including gradually reducing, while taking time of 2 ns or more, write energy injected at a time a write pulse falls.

It should be noted that the write pulse may be controlled based on voltage control, current control, or power control.

Effect of the Invention

According to the recording method for a magnetic memory device of the present invention, by setting the fall time of the write power injected at the time the write pulse falls to be 2 ns or more as shown in embodiments and examples to be described later, even when a write pulse considerably larger than an inversion threshold value is applied, a write error rate equivalent to that obtained when a write pulse a little larger than the inversion threshold value is applied can be secured. Regardless of whether a waveform of the write pulse is a square wave or a triangular wave, the waveform of the write pulse at the time of the fall is important in essence.

It cannot be said that a mechanism that causes the high recording voltage error described above and a mechanism for suppressing the appearance by the present invention have become fully clear. However, considering the fact that no problem arises when a write pulse a little larger than the inversion threshold value is applied but that phenomenon occurs when a write pulse considerably larger than the inversion threshold value is applied and, in addition, a write error rate increases as the write pulse becomes larger, it can be predicted that an injection of an excessive amount of write energy as compared to the inversion threshold value is inducing the problem. Further, as shown in the embodiments to be described later, since the write error rate decreases as the write pulse gradually reduces to become equal to or smaller than the inversion threshold value at the time of the fall, it can be considered that, for suppressing the appearance of the high recording voltage error described above, it is essential for excessive energy added up to that time to be dissipated and removed to a level that causes no problem at a time point the write pulse is reduced to become equal to or smaller than the inversion threshold value. The present invention satisfies such a condition by securing a sufficient time before the write pulse is reduced to become equal to or smaller than the inversion threshold value at the time the write pulse falls.

BEST MODES FOR CARRYING OUT THE INVENTION

Figure 1:
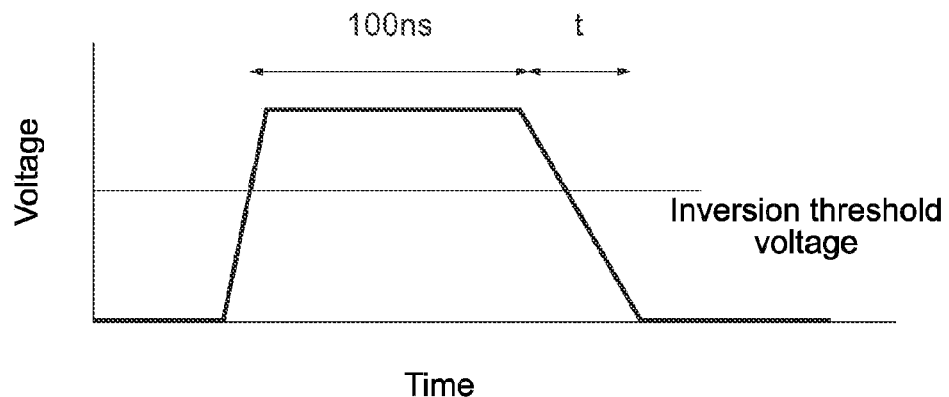
FIG. 1(a) shows a write pulse waveform in a recording method for a magnetic memory device according to a first embodiment of the present invention.
FIG. 1(b) is a graph showing a relationship between a write error rate and a fall time t.
Figure 1:
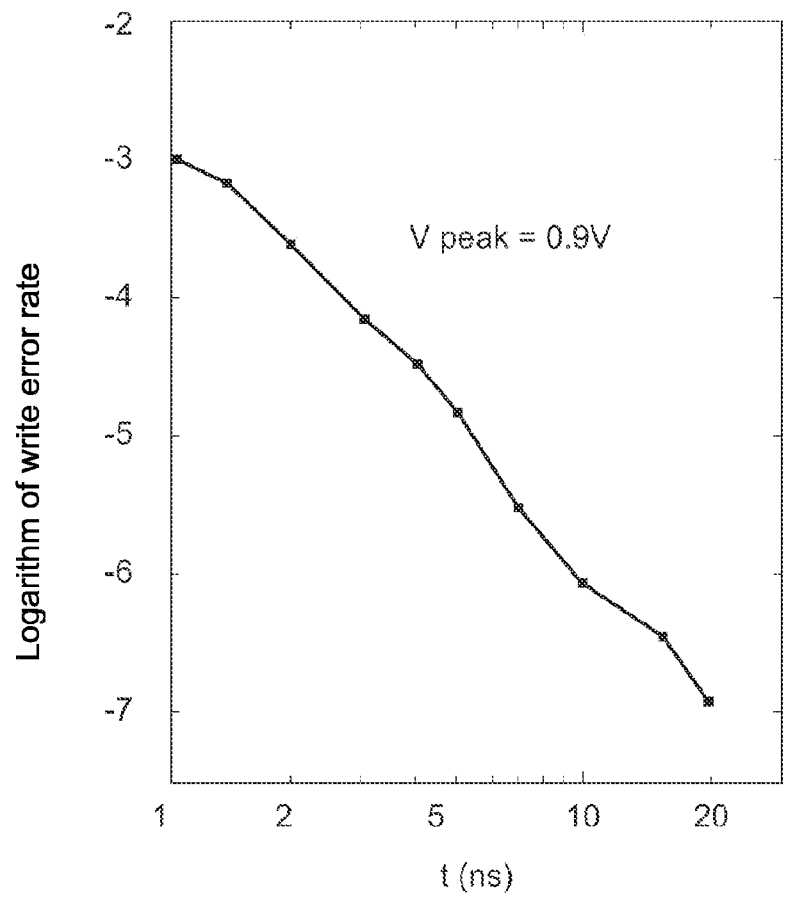

In a recording method for a magnetic memory device according to the present invention, it is desirable to take time of 5 ns or more to reduce write power to be injected at a time of a fall. It is also desirable to take time of 100 ns or less to reduce write power to be injected at the time of the fall. As will be described later in a first embodiment, when linearly reducing a write pulse voltage at the time of the fall, an effect of lowering a write error rate is obtained when a fall time is 2 ns or more and becomes larger as the fall time becomes longer. The fall time used herein refers to a time during which a pulse height decreases from 90% to 10%. An enhancement of the error rate reduction effect due to an increase in the fall time becomes maximum when the fall time is around 5 ns and kept large until the fall time reaches 100 ns. The effect is saturated when the fall time exceeds about 100 ns, and a degree by which the error rate reduction effect is enhanced is small even when the fall time is increased more than that. On the other hand, since a time required for write becomes longer as the fall time is prolonged, the fall time is desirably 100 ns or less.

Moreover, it is desirable to take time of 2 ns or more to gradually reduce a voltage of the write pulse at the time of the fall. A control method for generating a write pulse can be executed under any of voltage control, current control, and power control.

It is also desirable for a rate of decline of the write pulse voltage at the time of the fall to change and become larger as time passes. This is for gradually reducing the write pulse voltage to a voltage smaller than an inversion threshold voltage while taking as long a time as possible. For example, in a case where a voltage waveform of the write pulse at the time of the fall is a smooth curve, it is desirable for the curve to be an upward convex curve than a downward convex curve. Moreover, in a case where the voltage waveform of the write pulse is a series of a plurality of straight lines having different tilts, it is desirable for the voltage waveform to have a shape that connects points of an upward convex curve than a shape that connects points of a downward convex curve.

Moreover, with a voltage with which an inversion rate of the magnetic memory device is halved being an inversion threshold voltage, it is desirable to keep, until the write pulse voltage at the time of the fall becomes smaller than the inversion threshold voltage, a rate of decline of the write pulse voltage smaller than that of a voltage at a time the pulse voltage is linearly reduced within the fall time.

It is also desirable to reduce the write pulse voltage at the time of the fall stepwise by two or more steps. Even when the voltage waveform is a waveform in which the voltage gradually reduces stepwise instead of reducing smoothly, the effect of suppressing a write error rate can be obtained. Though the effect is limited, there is an advantage in formability for circuits.

At this time, it is desirable to reduce the write pulse voltage at the time of the fall at least once to a voltage larger than the inversion threshold voltage of the magnetic memory device.

Next, embodiments of the present invention will be specifically described with reference to the drawings. Here, a difference in the effect of suppressing a write error rate due to a difference in a write pulse voltage waveform at the time of the fall will be discussed.

First Embodiment

In a first embodiment, an example of a recording method for a spin injection MTJ device according to claims 1 to 4 will mainly be described.

Figure 13:
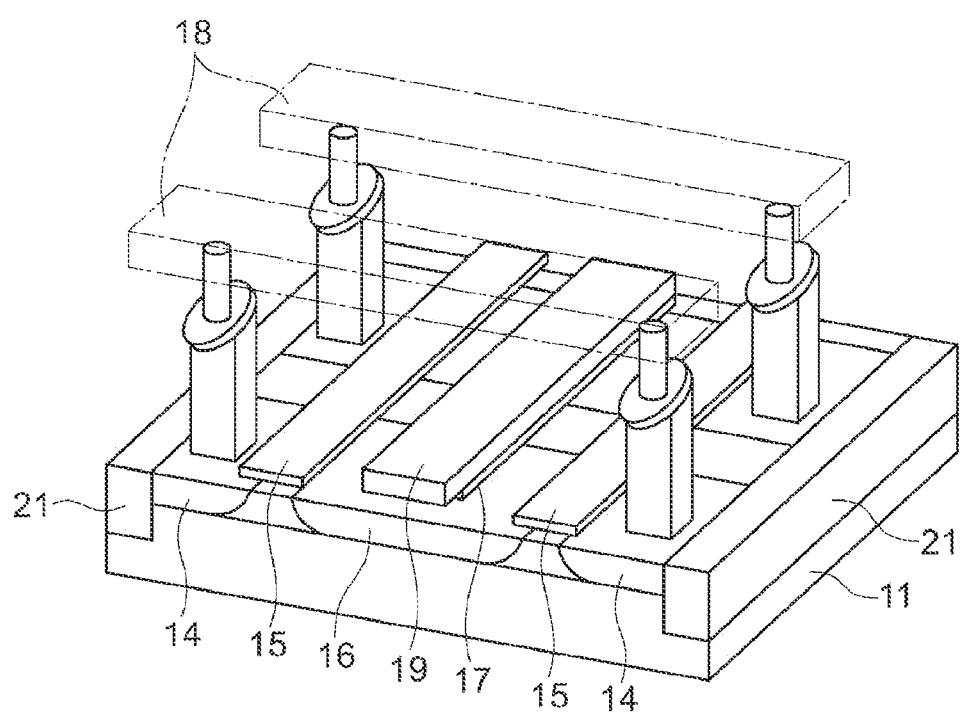
FIG. 13 is a partial perspective view showing a memory cell structure of a spin torque MRAM according to the embodiment of the present invention.
Figure 14:
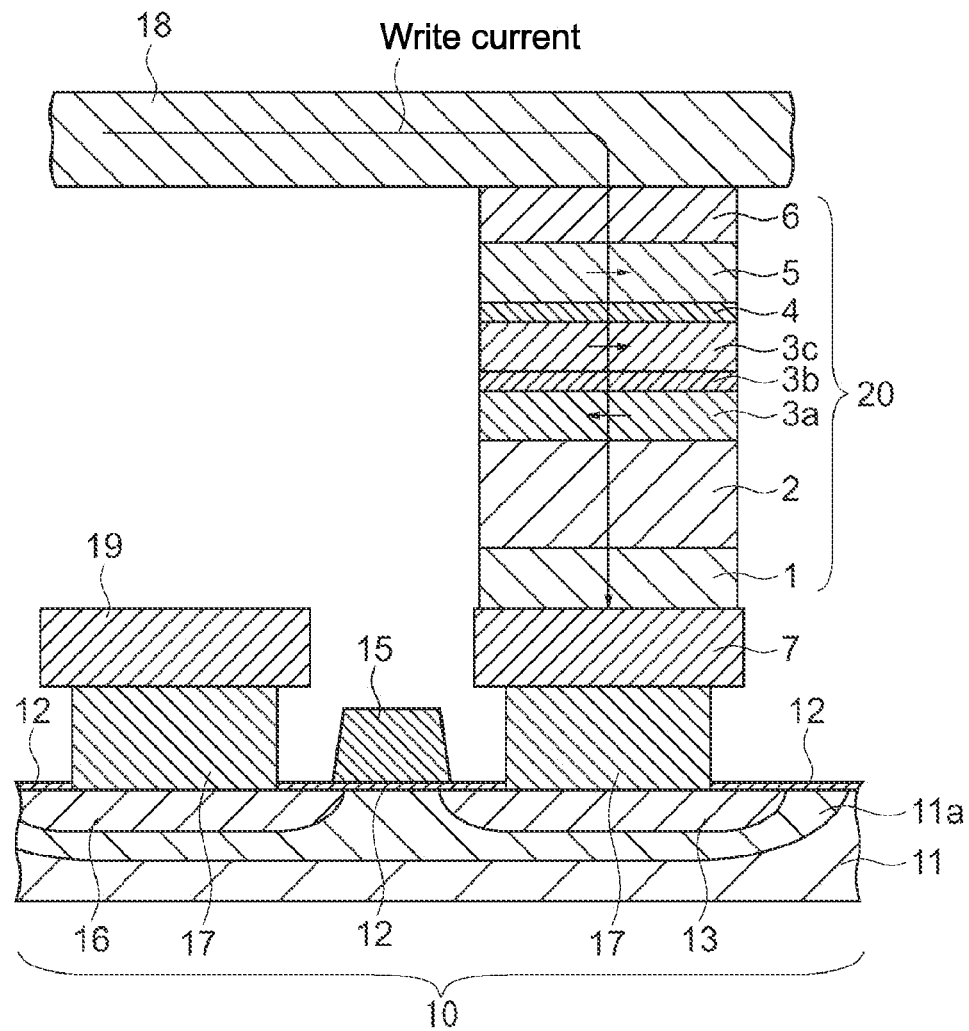
FIG. 14 is a cross-sectional diagram showing a structure of a spin injection MTJ device according to the embodiment of the present invention.

A memory cell structure of a spin torque MRAM used in this embodiment and a structure of a spin injection MTJ device are shown in FIGS. 13 and 14.

FIG. 13 is a partial perspective view showing an example of a structure of an MRAM that is constituted of an MTJ device whose magnetization direction is inverted by a spin injection (hereinafter, referred to as spin injection MTJ device) and uses a magnetization inversion by the spin injection (hereinafter, referred to as spin torque MRAM). In the spin torque MRAM, word lines 15 as row wirings and bit lines 18 as column wirings are arranged in a matrix, and one spin injection MTJ device 20 is arranged at each intersection, to thus form a memory cell corresponding to 1 bit. FIG. 13 shows four memory cells.

On a semiconductor substrate 11 at a lower portion, a selection transistor 10 to be described later is formed in each memory cell, and the word line 15 also functions as a gate electrode of the selection transistor 10. Moreover, a drain area 16 is commonly formed for the selection transistors shown on both sides in the figure, and a row wiring 19 is connected to the drain area 216.

FIG. 14 is a partial cross-sectional diagram showing a memory cell structure of the spin torque MRAM. At a center portion of the memory cell, the spin injection MTJ device 20 is formed by laminating, in the stated order from the bottom layer, a base layer 1, an antiferromagnetic layer 2, a magnetization fixing layer 3a, an intermediate layer 3b, a magnetization reference layer 3c, a tunnel insulation layer 4, a recording layer 5, and a protective layer 6.

The magnetization fixing layer 3a, the intermediate layer 3b, and the magnetization reference layer 3c are laminated on the antiferromagnetic layer 2 and constitute a fixed magnetization layer as a whole. A magnetization direction of the magnetization fixing layer 3a constituted of a ferromagnetic conductor is fixed by the antiferromagnetic layer 2. The magnetization reference layer 3c similarly constituted of a ferromagnetic conductor forms an antiferromagnetic bond with the magnetization fixing layer 3a via the intermediate layer 3b as a nonmagnetic layer. As a result, a magnetization direction of the magnetization reference layer 3c is fixed in a direction opposite to the magnetization direction of the magnetization fixing layer 3a. In the example shown in FIG. 14, the magnetization direction of the magnetization fixing layer 3a is fixed in a left-hand direction, and the magnetization direction of the magnetization reference layer 3c is fixed in a right-hand direction.

Since a sensitivity of the fixed magnetization layer with respect to an external magnetic field can be lowered when the fixed magnetization layer has the multilayer ferrimagnetic structure described above, it is possible to suppress a magnetization fluctuation of the fixed magnetization layer due to the external magnetic field and improve a stability of the MTJ device. In addition, since magnetic fluxes that leak out from the magnetization fixing layer 3a and the magnetization reference layer 3c cancel each other out, the magnetic flux that leaks out from the fixed magnetization layer can be suppressed to a minimum level by adjusting film thicknesses of those layers.

The recording layer 5 is constituted of a ferromagnetic conductor having uniaxial magnetic anisotropy and capable of changing a magnetization direction by an external operation and holding the magnetization direction as information. For example, which of "parallel" and "nonparallel" the magnetization direction is with respect to the magnetization direction of the magnetization reference layer 3c is stored as information of "0" and "1". The tunnel insulation layer 4 as a thin nonmagnetic insulation layer is interposed between the magnetization reference layer 3c and the recording layer 5, and the magnetization reference layer 3c, the tunnel insulation layer 4, and the recording layer 5 form an MTJ (Magnetic Tunnel Junction).

On the other hand, at a lower portion of the memory cell, a MOS-type field-effect transistor constituted of a gate insulation film 12, a source electrode 13, a source area 14, a gate electrode 15, the drain area 16, and drain electrodes 17 is provided as the selection transistor 10 for selecting a memory cell in a device-isolated well area 11a of the semiconductor substrate 11 such as a silicon substrate.

As described above, the gate electrode 15 of the selection transistor 10 is formed as a band connecting the cells and also functions as a word line as a first row wiring. Moreover, the drain electrodes 17 are connected to the row wiring 19 as a second row wiring, and the source electrode 13 is connected to the base layer 1 of the spin injection MTJ device 20 via a connection plug 7. On the other hand, the protective layer 6 of the spin injection MTJ device 20 is connected to the bit line 18 as the column wiring provided at the upper portion of the memory cell.

For recording information onto the spin injection MTJ device 20 of a desired memory cell, a selection signal is applied to the word line 15 of a row included in the desired memory cell to put the entire selection transistor 210 of that row to an ON (conductive) state. At the same time, a write voltage is applied between the bit line 18 of a column included in the desired memory cell and the row wiring 19. As a result, a desired memory cell is selected, a spin-polarized current flows through the recording layer 5 of the spin injection MTJ device 20, and the recording layer 5 is magnetized in a predetermined magnetization direction, to thus record information.

At this time, the magnetization direction of the magnetization reference layer 3c of the spin injection MTJ device 20 is first "nonparallel" to the magnetization direction of the recording layer 5. When inverting the magnetization direction of the recording layer 5 to be "parallel" to the magnetization direction of the magnetization reference layer 3c by write, a write current having a current density equal to or larger than a threshold value is caused to flow from the recording layer 5 to the magnetization reference layer 3c as shown in FIG. 14. Accordingly, a spin-polarized electron stream having an electron density equal to or larger than a threshold value flows substantively from the magnetization reference layer 3c to the recording layer 5 to thus cause a magnetization inversion.

Conversely, when inverting the magnetization direction of the magnetization reference layer 3c that is "parallel" to the magnetization direction of the recording layer 5 to be "nonparallel", a write current having a current density equal to or larger than a threshold value is caused to flow in the opposite direction, that is, from the magnetization reference layer 3c to the recording layer 5 so that an electron stream having an electron density equal to or larger than a threshold value flows substantively from the recording layer 5 to the magnetization reference layer 3c.

Further, information is read out from the spin injection MTJ device 20 using the TMR effect as in the case of the MTJ device 100. While write and read with respect to the spin injection MTJ device 20 both use a mutual action between the electron of the recording layer 5 and the spin-polarized current that flows through the recording layer 5, read is performed in an area where the current density of the spin-polarized current is small, whereas write is performed in an area where the current density of the spin-polarized current is large and exceeds a threshold value.

It should be noted that for preventing a magnetization from being inverted or becoming unstable during a recording operation, the magnetization reference layer 3c may have a magnetization direction fixed in combination with an antiferromagnetic body such as PtMn and IrMn, use a material having a large coercive force such as CoPt, used after being processed in a larger area than the recording layer 5, or magnetized in a certain direction by an external magnetic field.

The magnetization reference layer 3c may be a single ferromagnetic layer or may magnetically bond in a nonparallel manner with the magnetization fixing layer 3a via the intermediate layer 3b constituted of a nonmagnetic metal such as Ru. The magnetization of the magnetization reference layer 3c may either be an in-plane magnetization or a perpendicular magnetization. Further, the magnetization reference layer 3c may be provided below or above the recording layer 5 or both below and above the recording layer 5.

It is desirable for the tunnel insulation layer 4 to be constituted of a ceramic material such as an oxide and a nitride. For obtaining a large magnetoresistance change rate, it is particularly desirable to provide a magnesium oxide MgO layer as the tunnel insulation layer 4 and provide a CoFeB layer on at least the tunnel insulation layer 4 side of the magnetization reference layer 3c and the recording layer 5.

FIG. 1(a) is a graph showing a write pulse waveform that is based on the first embodiment of the present invention. The write pulse is a voltage control pulse and a maximum application voltage thereof is 0.9 V. In the write pulse, a fall time at a time of a fall is represented by t, and a write pulse voltage is reduced linearly during the time t.

FIG. 1(b) is a graph showing a relationship between an actually-measured write error rate and fall time t. The graph is obtained using a spin torque MRAM constituted of a spin injection MTJ device 20 structured by the following layers.

Base layer 1: Ta film having film thickness of 5 nm
Antiferromagnetic layer 2: PtMn film having film thickness of 30 nm
Magnetization fixing layer 3a: CoFe film having film thickness of 2 nm
Intermediate layer 3b: Ru film having film thickness of 0.7 nm
Magnetization reference layer 3c: CoFeB film having film thickness of 2 nm
Tunnel insulation layer 4: Magnesium oxide MgO film having film thickness of 0.8 nm
Recording layer 5: CoFeB film having film thickness of 3 nm
Protective layer 6: Ta film having film thickness of 5 nm Moreover, a planar shape of the spin injection MTJ device 20 is an oval having a long axis length of 150 nm to 250 nm and a short axis length of 70 nm to 85 nm.

It can be seen from FIG. 1(b) that the effect of reducing a write error rate is obtained when the fall time t is 2 ns or more and becomes larger as the fall time t becomes longer. This is because, by securing a longer time for a period from a start of the fall to a time the write pulse voltage is lowered to a voltage equal to or smaller than the inversion threshold voltage, a larger amount of excessive energy added by the write pulse is dissipated and removed to a level that causes no problem as described above.

A rate by which the effect of reducing an error rate is enhanced by an increase in the fall time becomes maximum when the fall time t is around 5 ns. Though an illustration of an experimental result in a case where the fall time is 20 ns or more is omitted, the rate by which the error rate reduction effect is enhanced by an increase in the fall time t is large until the fall time t reaches about 100 ns. However, the effect is saturated when the fall time t exceeds about 100 ns, and the rate by which the error rate reduction effect is enhanced is small even when the fall time t is prolonged more than that. On the other hand, since there is a disadvantage that a time required for write is prolonged when the fall time t becomes too long, it is desirable for the fall time t to be 100 ns or less.

Second Embodiment

In a second embodiment, an example of a recording method for a spin injection MTJ device according to claims 5 and 6 will mainly be described.

Figure 2:
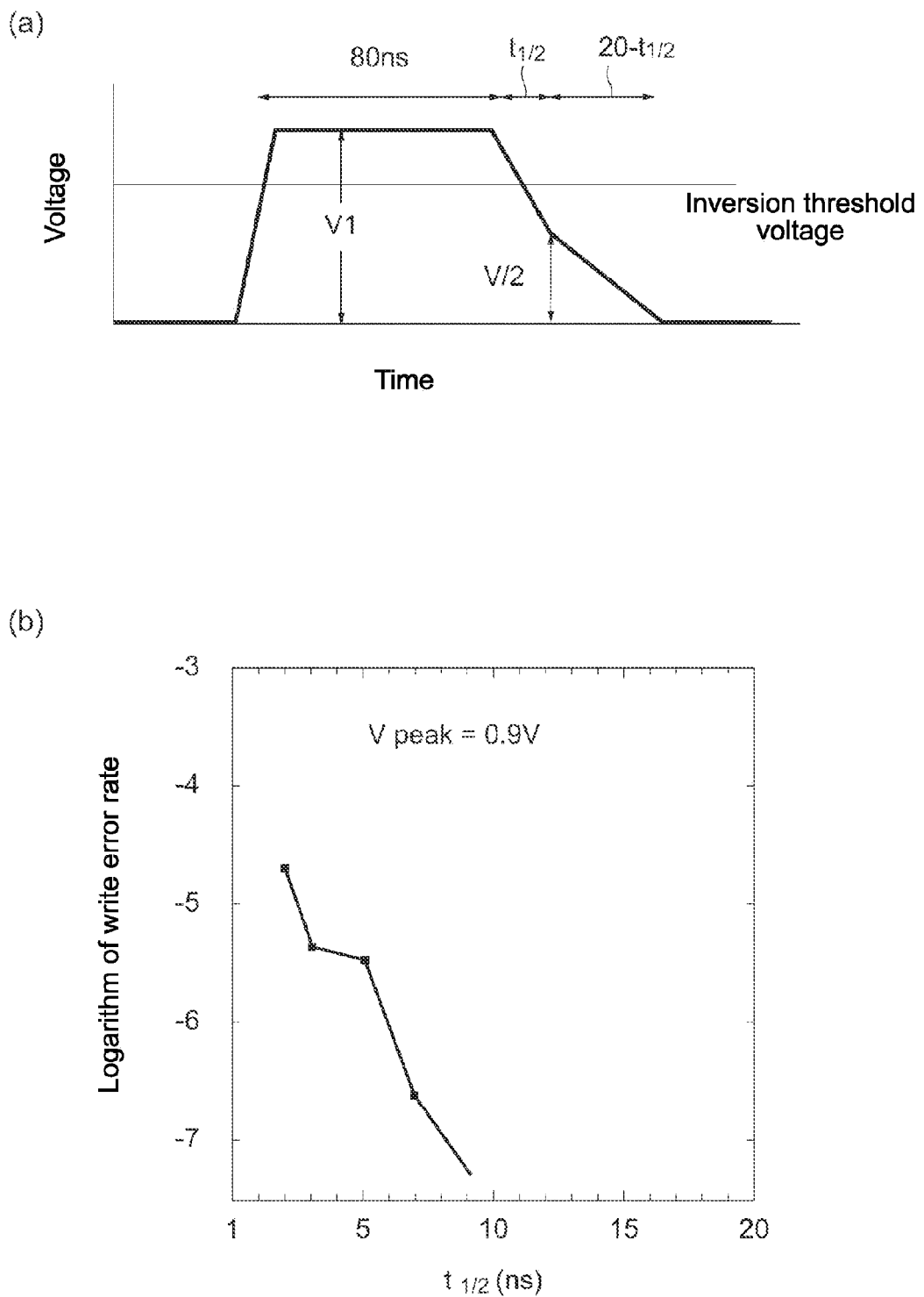
FIG. 2(a) shows a write pulse waveform in the recording method for a magnetic memory device according to a second embodiment of the present invention.
FIG. 2(b) is a graph showing a relationship between the write error rate and a halve time $t_{1/2}$.

FIG. 2(*a*) is a graph showing a write pulse waveform that is based on the second embodiment of the present invention. The write pulse is a voltage control pulse and a maximum application voltage thereof is 0.9 V. In the write pulse, the fall time at the time of the fall is set to be constant at 20 ns, and a time required for the write pulse voltage to become half the maximum application voltage is referred to as halve time $t_{1/2}$ ns. The write pulse voltage is linearly reduced to half the voltage during a period from the start of the fall to the halve time $t_{1/2}$ ns and linearly reduced to 0 during the remaining $(20-t_{1/2})$ ns.

The write pulse voltage at the time of the fall is linearly reduced in each section, but looking at the entire fall waveform, the waveform resembles that obtained by approximating a graph of a downward convex curve in a case where "$t_{1/2}$<10 ns" is established and is similar to a fall waveform in a case where a capacitance C and a resistance R are added to a drive circuit to increase a time constant and edges of a pulse waveform are taken off (FIG. 2(*a*) shows an example of the write pulse waveform in the case where "$t_{1/2}$<10 ns" is established and a waveform is approximated to a downward convex curve). Further, the fall waveform becomes linear in the case of $t_{1/2}$=10 ns and is the same as that of the first embodiment with t=20 ns. Furthermore, in the case of $t_{1/2}$>10 ns, the waveform resembles that obtained by approximating a graph of an upward convex curve.

FIG. 2(*b*) is a graph showing a relationship between the write error rate and the halve time $t_{1/2}$, that have been actually measured using a spin torque MRAM constituted of a spin injection MTJ device having the same layer structure as that used in the first embodiment. The effect of reducing a write error rate becomes larger as the halve time $t_{1/2}$ is prolonged. The reason why data within a range of the halve time $t_{1/2}$ of 10 ns to 20 ns is not shown is because no error was observed during the time the experiment was conducted, and the write error rate within the range of $t_{1/2}$=10 ns to 20 ns is considered to be an extension of the graph shown in FIG. 2(*b*).

It can be seen from the results described above that while the write error rate is reduced when the pulse voltage waveform at the time of the fall resembles a downward convex curve, the effect is relatively small, whereas when the pulse voltage waveform at the time of the fall resembles an upward convex curve, the effect of reducing a write error rate is large, which is more desirable. The reason for this is considered to be because, as compared to the case where the pulse voltage waveform resembles a downward convex curve, the pulse voltage takes a long time to be gradually lowered to a voltage smaller than the inversion threshold voltage when the pulse voltage waveform resembles an upward convex curve. It should be noted that although not shown, the entire fall time is longer the better (20 ns in the case of FIG. 2).

Third Embodiment

In a third embodiment, an example of a recording method for a spin injection MTJ device according to claim 7 will mainly be described.

Figure 3:
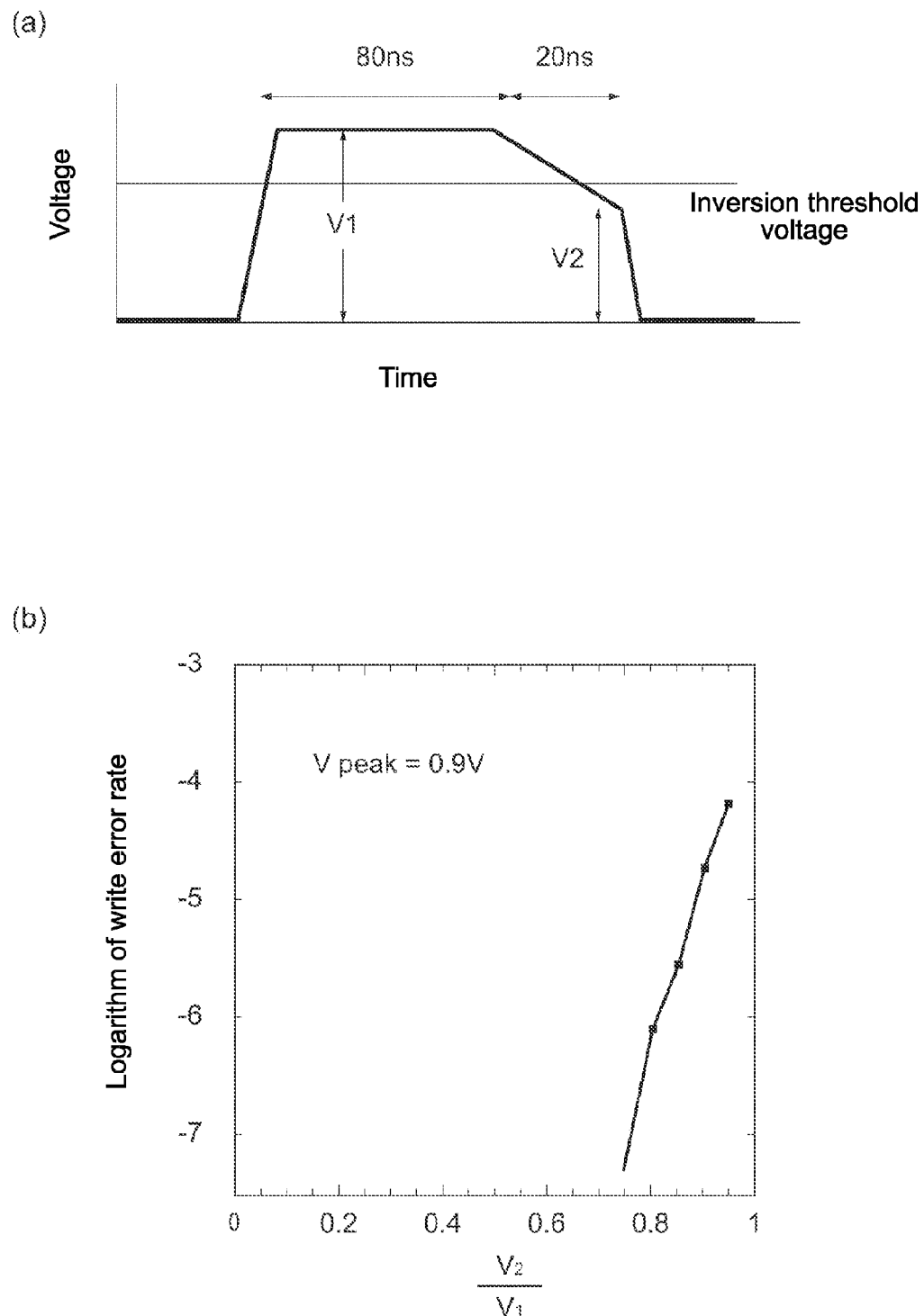
FIG. 3(a) shows a write pulse waveform in the recording method for a magnetic memory device according to a third embodiment of the present invention.
FIG. 3(b) is a graph showing a relationship between the write error rate and a reduction voltage V2.

FIG. 3(*a*) is a graph showing a write pulse waveform that is based on the third embodiment of the present invention. The write pulse is a voltage control pulse and a maximum application voltage V1 thereof is 0.9 V. In the write pulse, the fall time at the time of the fall is set to be constant at 20 ns, and the write pulse voltage is linearly and gradually reduced to a reduction voltage V2 during a period from the start of the fall to approximately 20 ns. After that, the write pulse voltage is reduced to 0 within a short time by applying a normal fall speed.

FIG. 3(*b*) is a graph showing a relationship between the write error rate and V2/V1, that have been actually measured using a spin torque MRAM constituted of a spin injection MTJ device having the same layer structure as that used in the first embodiment. As can be seen from FIG. 3(*b*), with a voltage with which the inversion rate of the spin injection MTJ device 20 becomes half the voltage being an inversion threshold voltage, the effect of reducing a write error rate is large when a rate of decline of the write pulse voltage is kept small until V2 becomes smaller than the inversion threshold voltage and the write pulse voltage at the time of the fall becomes smaller than the inversion threshold voltage. In this case, the same write error rate reduction effect as in the case of the first embodiment where the fall time t is large can be obtained. On the other hand, by applying a normal fall speed after the write pulse voltage reaches the reduction voltage V2, a time required for the fall can be shortened as compared to the first and second embodiments. As described above, the pulse waveform of this embodiment is an effective pulse waveform with which accurate write and a short write time can both be realized.

Fourth Embodiment

In a fourth embodiment, an example of a recording method for a spin injection MTJ device according to claims 8 and 9 will mainly be described.

Figure 4:
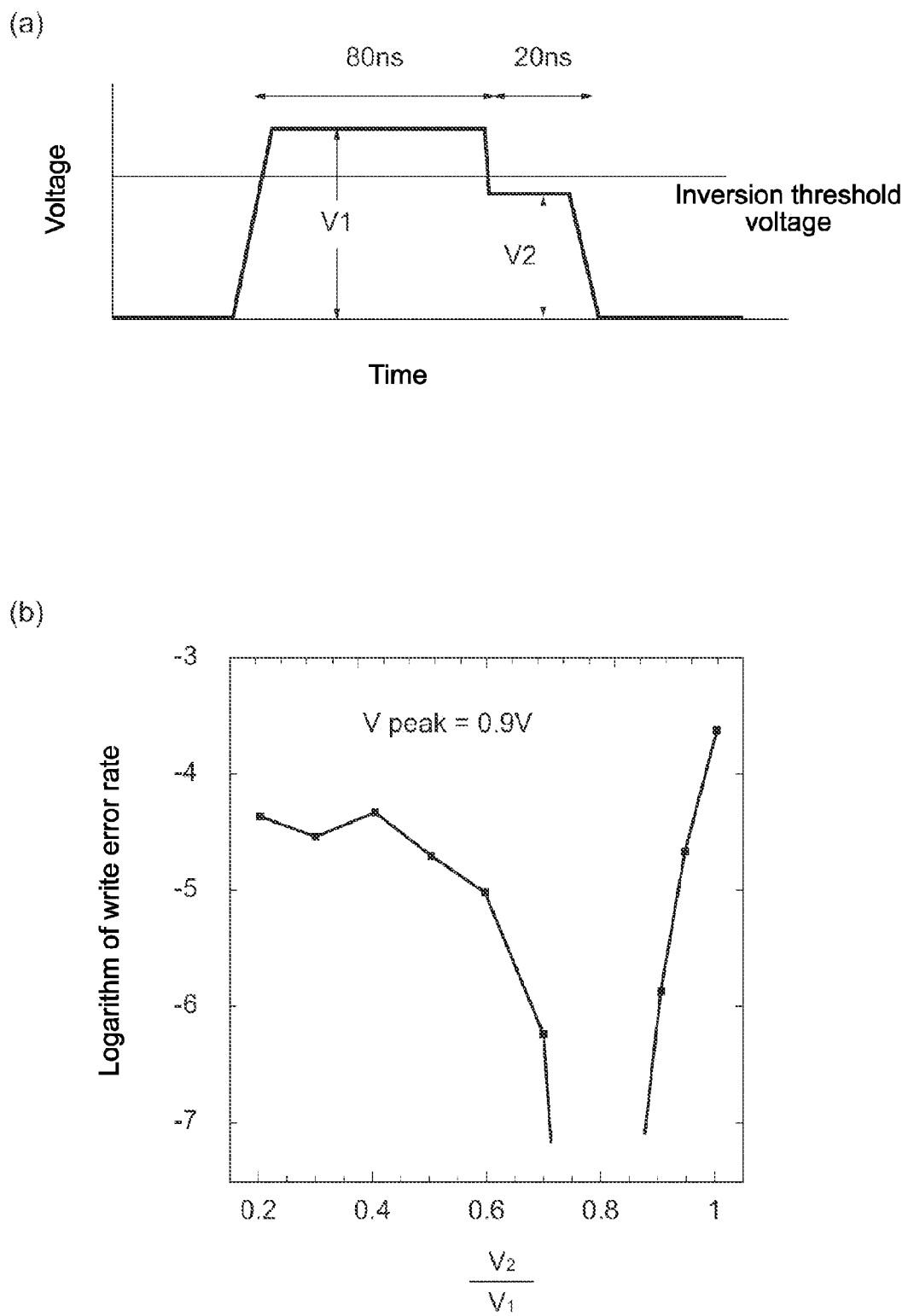
FIG. 4(a) shows a write pulse waveform in the recording method for a magnetic memory device according to a fourth embodiment of the present invention.
FIG. 4(b) is a graph showing a relationship between the write error rate and a step reduction voltage V2.

FIG. 4(*a*) is a graph showing a write pulse waveform that is based on the fourth embodiment of the present invention. The write pulse is a voltage control pulse and a maximum application voltage V1 thereof is 0.9 V. In the write pulse, the fall time is set to be constant at approximately 20 ns, and the write pulse voltage is once reduced to a step reduction voltage V2 within a short time by applying a normal fall speed at the start of the fall. After maintaining the write pulse voltage constant for 20 ns thereafter, the write pulse voltage is reduced to 0 within a short time by applying the normal fall speed again.

FIG. 4(*b*) is a graph showing a relationship between the write error rate and V2/V1, that have been actually measured using a spin torque MRAM constituted of a spin injection MTJ device having the same layer structure as that used in the first embodiment. As can be seen from FIG. 2(b), though an effective range of V2/V1 is limited in the case of a step-like pulse waveform, if V2 is selected to be a little larger than the inversion threshold voltage, the effect of suppressing a write error rate is enhanced. Moreover, though not shown, the effect of suppressing a write error rate becomes higher when the pulse voltage waveform at the time of the fall is a step-like waveform having 3 or more steps than a waveform having two or more steps.

Next, a write pulse generator circuit of the above embodiments will be described.

Figure 5:
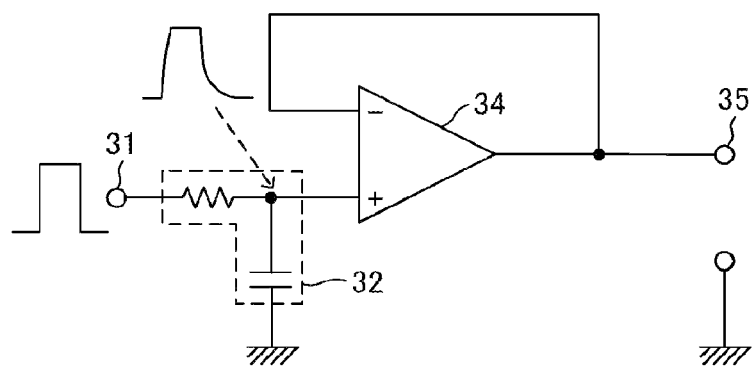
FIG. 5 is a diagram showing a structure of a write pulse generator circuit for generating a write pulse by voltage control.

FIG. 5 is a diagram showing a structure of a write pulse generator circuit 30 for generating a write pulse by voltage control.

The write pulse generator circuit 30 is constituted of a CR circuit 32 and a negative feedback amplifier circuit 33 that uses an operational amplifier. A rectangular write pulse is input to an input terminal 30 of the write pulse generator circuit. The rectangular pulse signal input to the input terminal 31 is converted to have a waveform whose fall time is 2 ns or more by the CR circuit 32 and input to a noninversion input terminal of the negative feedback amplifier circuit 33. From the negative feedback amplifier circuit 33, a signal corresponding to a difference between the signal input to the noninversion input terminal and a negative feedback signal input to an inversion input terminal is output from an output terminal 34 as a write pulse.

It is also possible to adopt the same structure that uses the CR circuit and the negative feedback amplifier circuit when generating a write pulse by power control or current control.

Figure 6:
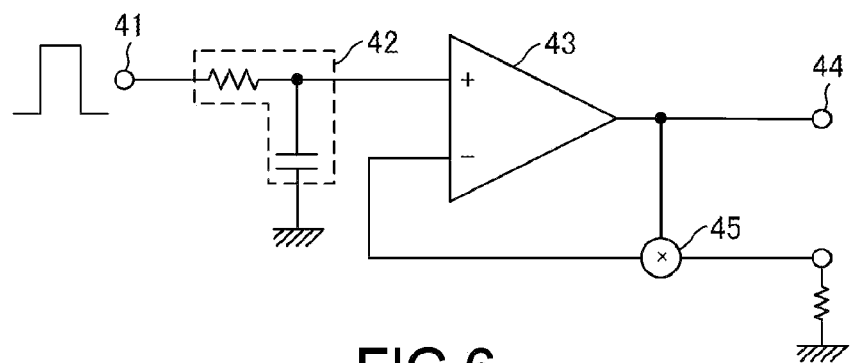
FIG. 6 is a diagram showing a structure of a write pulse generator circuit for generating a write pulse by power control.

FIG. 6 is a diagram showing a structure of a write pulse generator circuit 40 for generating a write pulse by power control. A structure in which a signal is converted to have a waveform whose fall time is 2 ns or more by a CR circuit 42 and input to a noninversion input terminal of a negative feedback amplifier circuit 43 is the same as that shown in FIG. 5. The write pulse generator circuit 40 that is based on power control includes a multiplier 45 that multiplies an output voltage and output current of the negative feedback amplifier circuit 43 and feeds back an output of the multiplier 45 to an inversion input terminal of the negative feedback amplifier circuit 43. From the negative feedback amplifier circuit 43, a signal corresponding to a difference between the signal input to the noninversion input terminal and the output signal of the multiplier 45 input to the inversion input terminal as a negative feedback signal is output from an output terminal 44 as a write pulse.

Figure 7:
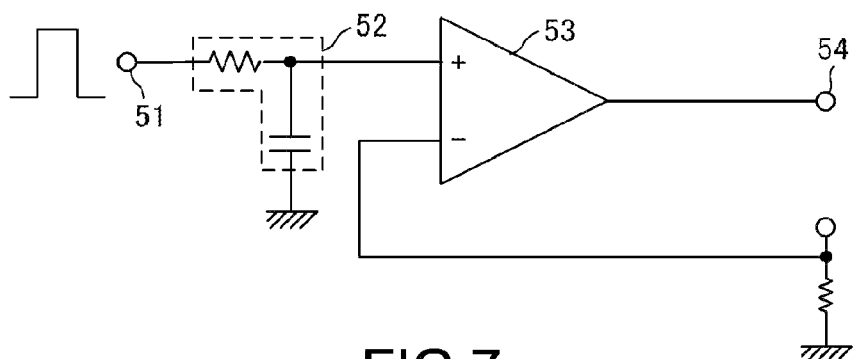
FIG. 7 is a diagram showing a structure of a write pulse generator circuit for generating a write pulse by current control.

FIG. 7 is a diagram showing a structure of a write pulse generator circuit 50 for generating a write pulse by current control. A structure in which a signal is converted to have a waveform whose fall time is 2 ns or more by a CR circuit 52 and input to a noninversion input terminal of a negative feedback amplifier circuit 53 is the same as that shown in FIG. 5. In the write pulse generator circuit 50 that is based on current control, a signal corresponding to an output current of the negative feedback amplifier circuit 53 is fed back to an inversion input terminal of the negative feedback amplifier circuit 53. From the negative feedback amplifier circuit 53, a signal corresponding to a difference between a signal input to a noninversion input terminal and the signal corresponding to the output current input to the inversion input terminal as a negative feedback signal is output from an output terminal 54 as a write pulse.

Figure 8:
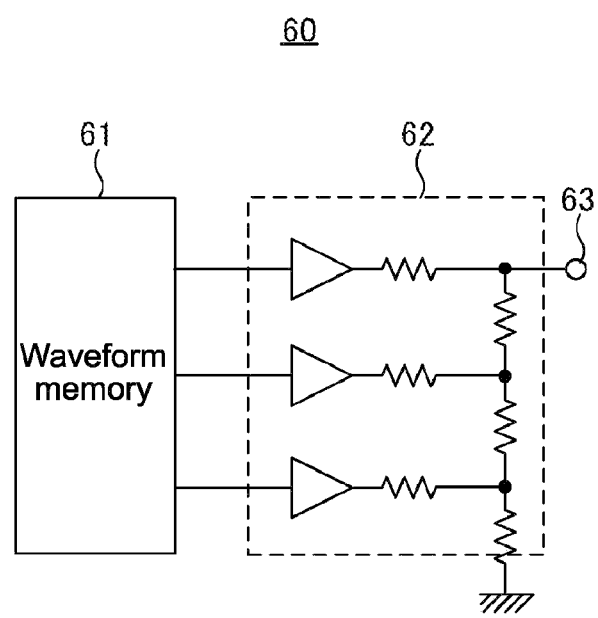
FIG. 8 is a diagram showing a structure of a write pulse generator circuit for generating a write pulse using a waveform memory and a D/A conversion circuit.
Figure 9:
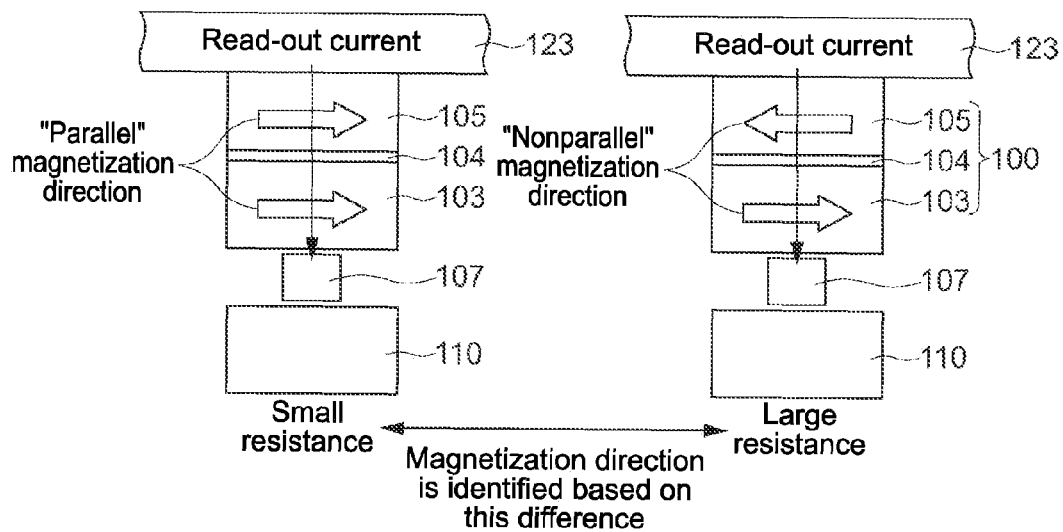
FIG. 9(a) is an explanatory diagram showing a basic structure of an MTJ device and an operation of reading out recorded information.
FIG. 9(b) is a partial perspective view showing an example of a memory cell structure of an MRAM constituted of the MTJ device.
Figure 9:
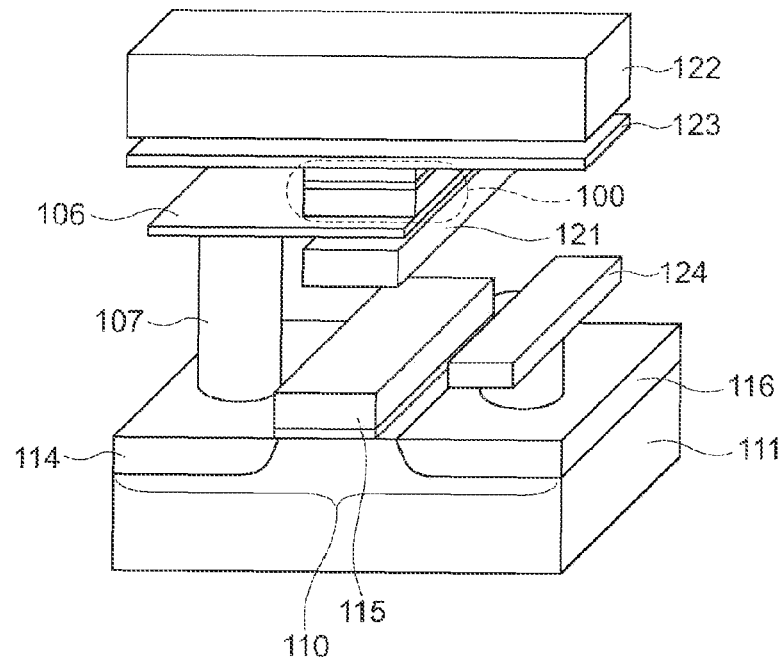
Figure 10:
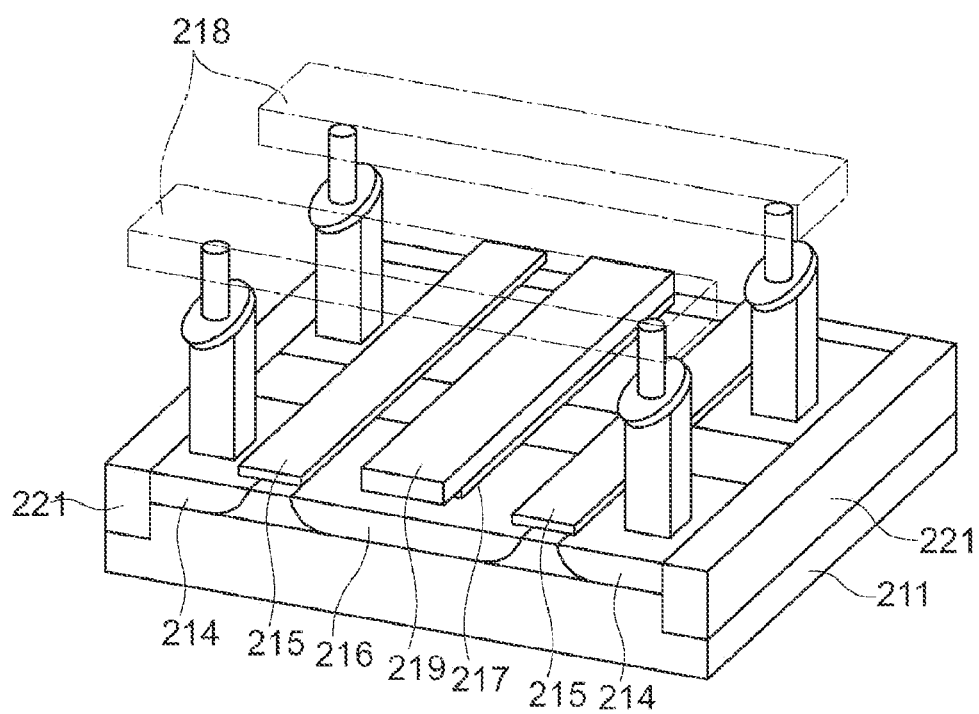
FIG. 10 is a partial perspective view showing a structure of a spin torque MRAM shown in Patent Document 2.
Figure 11:
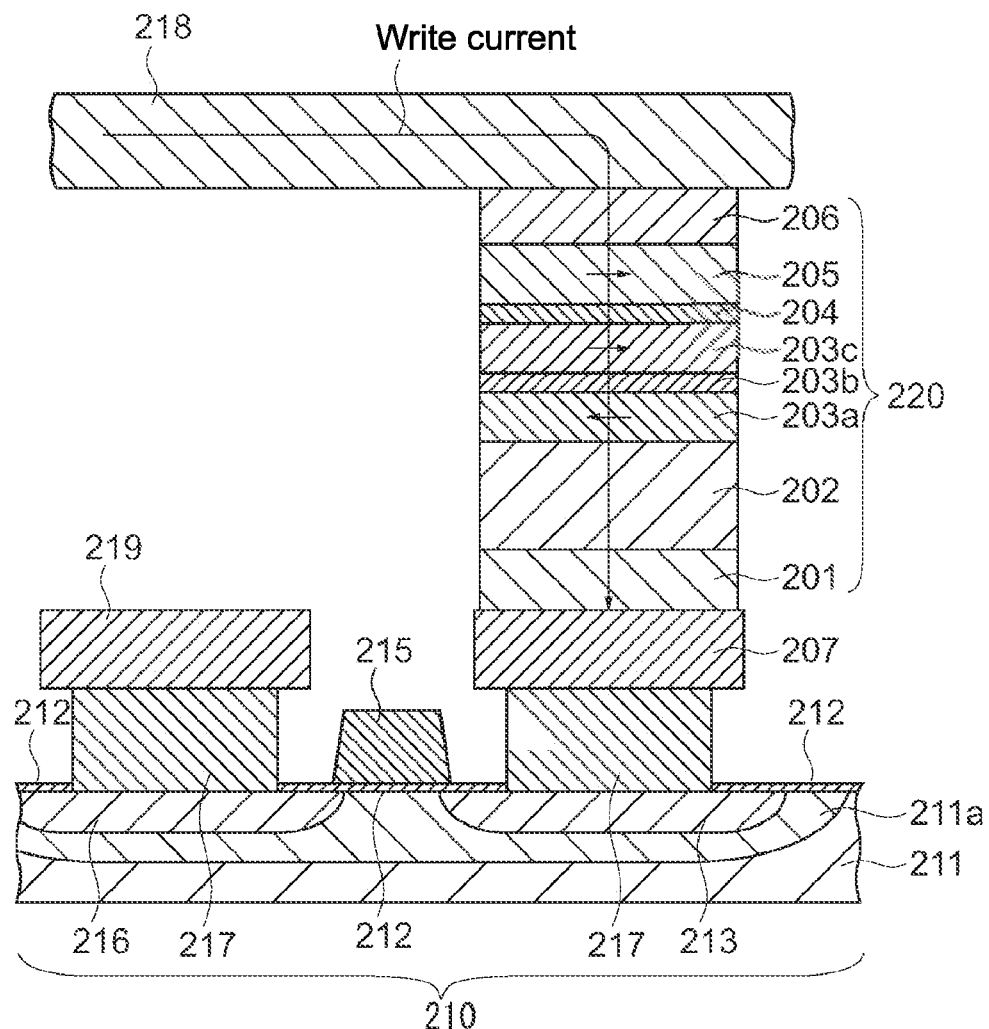
FIG. 11 is a partial cross-sectional diagram showing a memory cell structure of a spin torque MRAM constituted of a spin injection MTJ device.
Figure 12:
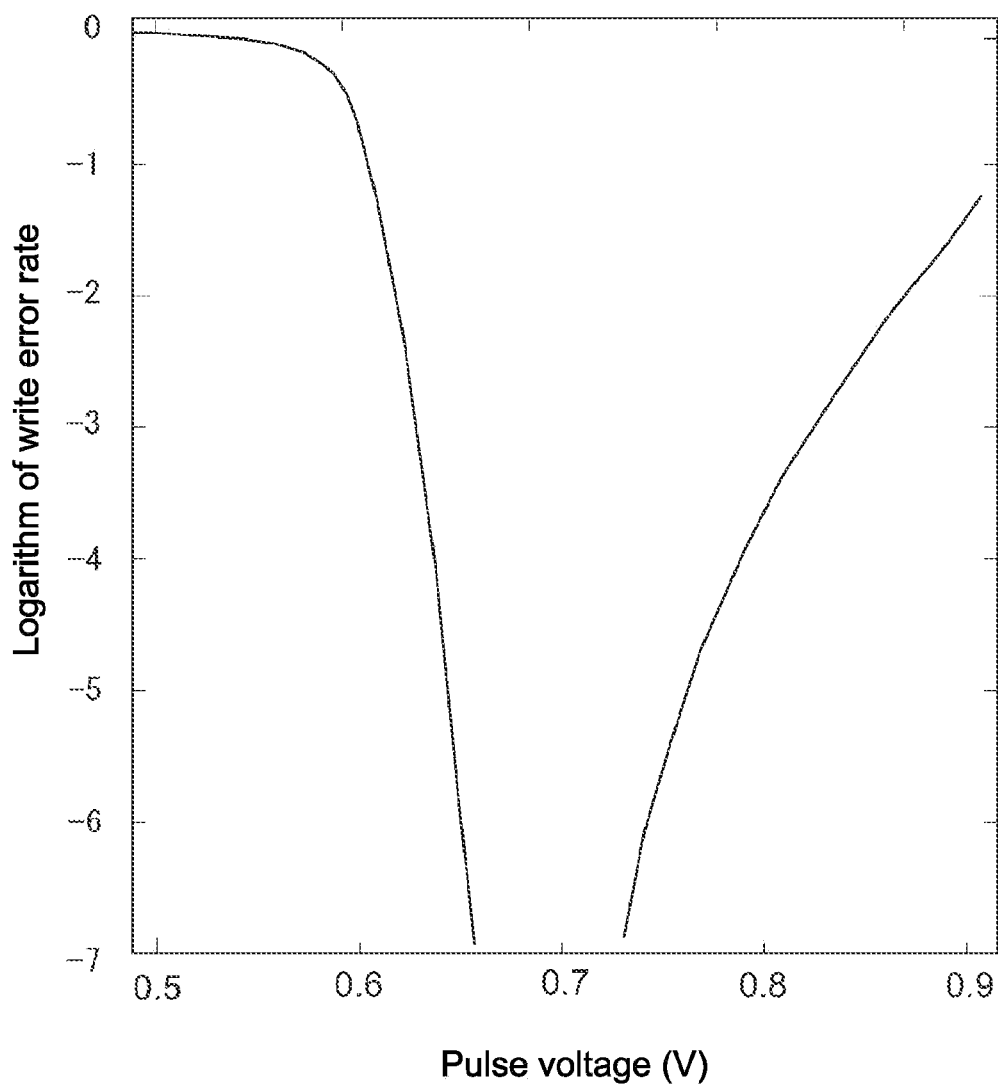
FIG. 12 is a graph showing a relationship between a write pulse voltage and the write error rate.

FIG. 8 is a diagram showing a structure of a write pulse generator circuit 60 for generating a write pulse using a waveform memory 61 and a D/A conversion circuit 62. The waveform memory 61 stores waveform data of a write pulse. With N bits whose output level can be selected from $2^N$ stages as 1 word, the waveform data of a write pulse is constituted of time-series data of a plurality of words. N ports for read are provided to the waveform memory 61, and the N ports are respectively connected to N input terminals of the D/A conversion circuit 62. The D/A conversion circuit 62 receives an input of waveform data of a write pulse for each N-bit data (1 word) from the waveform memory 61, converts it into an analog signal, and outputs it as a write pulse. The D/A conversion circuit 62 can be constituted of, for example, a ladder resistance circuit. By using such a write pulse generator circuit, a write pulse waveform can be obtained with a high degree of freedom, and write pulses of the above embodiments can be obtained easily with a high degree of freedom.

It should be noted that in the example of FIG. 8, the bit count N of 1 word has been set to "3" so that the output level can be selected from $2^3$ stages. However, the present invention is not limited thereto.

Heretofore, the present invention has been described based on the embodiments, but the present invention is of course not limited to those examples and can be changed as appropriate without departing from the gist of the present invention.

INDUSTRIAL APPLICABILITY

According to the present invention, a spin injection magnetization inversion-type MTJ device with improved transient characteristics at a time of write, less write failures, and a small threshold value of a write current density and with which high integration, high speed, and low power consumption are possible can be realized so as to contribute to a practical realization of a compact, light, and inexpensive nonvolatile memory.

DESCRIPTION OF SYMBOLS 1 base layer
2 antiferromagnetic layer
3a magnetization fixing layer
3b intermediate layer
3c magnetization reference layer
4 tunnel insulation layer
5 recording layer
6 protective layer
7 connection plug
10 selection transistor
11 semiconductor substrate
11a well area
12 gate insulation film
13 source electrode
14 source area
15 gate electrode
16 drain area
17 drain electrode
18 bit line
19 row wiring
20 spin injection magnetization inversion MTJ device
21 device-isolated structure
30, 40, 50, 60 write pulse generator circuit

The invention claimed is:

1. A recording method for a magnetic memory device including at least a recording layer that is constituted of a ferromagnetic conductor, capable of changing a magnetization direction, and holds information as a magnetization direction of a magnetic body and a magnetization reference layer whose magnetization direction is fixed and that is provided with respect to the recording layer with an insulation layer interposed therebetween, constituted of a ferromagnetic conductor, and becomes a reference of the magnetization direction, the magnetic memory device being recorded with information by a current flowing between the recording layer and the magnetization reference layer via the insulation layer, the recording method comprising gradually reducing, while taking time of 2 ns or more, write energy injected at a time a write pulse falls.

2. The recording method for a magnetic memory device according to claim 1,
wherein the write energy injected at the time of the fall is reduced while taking time of 5 ns or more.

3. The recording method for a magnetic memory device according to claim 1,
wherein the write energy injected at the time of the fall is reduced while taking time of 100 ns or less.

4. The recording method for a magnetic memory device according to claim 1,
wherein a voltage of the write pulse at the time of the fall is gradually reduced while taking time of 2 ns or more.

5. The recording method for a magnetic memory device according to claim 4,
wherein a rate of decline of the voltage of the write pulse at the time of the fall is increased as time passes.

6. The recording method for a magnetic memory device according to claim 4,
wherein a rate of decline of the voltage of the write pulse at the time of the fall is kept small until the voltage of the write pulse at the time of the fall becomes smaller than an inversion threshold voltage of the magnetic memory device.

7. The recording method for a magnetic memory device according to claim 4,
wherein the voltage of the write pulse at the time of the fall is reduced stepwise.

8. The recording method for a magnetic memory device according to claim 7,
wherein the voltage of the write pulse at the time of the fall is reduced at least once to a voltage larger than an inversion threshold voltage of the magnetic memory device.

9. A recording method for a magnetic memory device including at least a recording layer that is constituted of a ferromagnetic conductor, capable of changing a magnetization direction, and holds information as a magnetization direction of a magnetic body and a magnetization reference layer whose magnetization direction is fixed and that is provided with respect to the recording layer with an insulation layer interposed therebetween, constituted of a ferromagnetic conductor, and becomes a reference of the magnetization direction, the magnetic memory device being recorded with information by a current flowing between the recording layer and the magnetization reference layer via the insulation layer, a fall time of write power injected at a time a write pulse falls being 2 ns or more.

10. The recording method for a magnetic memory device according to claim 9,
wherein the fall time of the write power injected at the time of the fall is 5 ns or more.

11. The recording method for a magnetic memory device according to claim 9,
wherein the fall time of the write power injected at the time of the fall is 100 ns or less.

12. The recording method for a magnetic memory device according to claim 9,
wherein a fall time of a voltage of the write pulse is 2 ns or more.

13. The recording method for a magnetic memory device according to claim 12,
wherein a rate of decline of the voltage of the write pulse at the time of the fall changes and becomes larger as time passes.

14. The recording method for a magnetic memory device according to claim 13,
wherein a time required for the voltage of the write pulse at the time of the fall to become half a maximum application voltage is half a pulse fall time or more.

15. The recording method for a magnetic memory device according to claim 13,
wherein, with a voltage with which an inversion rate of the magnetic memory device becomes half as large being an inversion threshold voltage, the rate of decline of the voltage of the write pulse at the time of the fall is kept smaller than a rate of decline of a voltage at a time the pulse voltage is reduced linearly within the fall time, until the voltage of the write pulse at the time of the fall becomes smaller than the inversion threshold voltage.

16. The recording method for a magnetic memory device according to claim 12,
wherein the voltage of the write pulse at the time of the fall is reduced stepwise by two steps or more.

17. The recording method for a magnetic memory device according to claim 16,
wherein the voltage of the write pulse at the time of the fall is reduced at least once to a voltage larger than an inversion threshold voltage of the magnetic memory device.

* * * * *